(12) United States Patent
Taguchi

(10) Patent No.: US 12,331,401 B2
(45) Date of Patent: Jun. 17, 2025

(54) VAPORIZATION SYSTEM

(71) Applicant: HORIBA STEC, Co., Ltd., Kyoto (JP)

(72) Inventor: Akihiro Taguchi, Kyoto (JP)

(73) Assignee: HORIBA STEC, Co., Ltd., Kyoto (JP)

(*) Notice: Subject to any disclaimer, the term of this patent is extended or adjusted under 35 U.S.C. 154(b) by 406 days.

(21) Appl. No.: 17/913,375

(22) PCT Filed: Feb. 3, 2021

(86) PCT No.: PCT/JP2021/003956
§ 371 (c)(1),
(2) Date: Sep. 21, 2022

(87) PCT Pub. No.: WO2021/192643
PCT Pub. Date: Sep. 30, 2021

(65) Prior Publication Data
US 2023/0134421 A1 May 4, 2023

(30) Foreign Application Priority Data

Mar. 23, 2020 (JP) ................ 2020-050937

(51) Int. Cl.
C23C 16/448 (2006.01)
C23C 16/44 (2006.01)
(Continued)

(52) U.S. Cl.
CPC .... C23C 16/45561 (2013.01); C23C 16/4409 (2013.01); C23C 16/448 (2013.01); C23C 16/52 (2013.01)

(58) Field of Classification Search
CPC .............. B01D 1/0082; C23C 16/4409; C23C 16/45561; C23C 16/52; C23C 16/448
See application file for complete search history.

(56) References Cited

U.S. PATENT DOCUMENTS

2002/0186965 A1  12/2002  Zimmer
2005/0284529 A1  12/2005  Iwabuchi
(Continued)

FOREIGN PATENT DOCUMENTS

CN  102470282 A  5/2012
CN  105714271 A  6/2016
(Continued)

OTHER PUBLICATIONS

ISA Japan Patent Office, International Search Report issued in International Application No. PCT/JP2021/003956, Apr. 6, 2021, WIPO, 7 pages.

(Continued)

Primary Examiner — Joseph A Miller, Jr.
(74) Attorney, Agent, or Firm — Alleman Hall & Tuttle LLP

(57) ABSTRACT

A vaporization system includes: a vaporization device that is configured to vaporize a liquid material and that includes an inlet port through which the liquid material is introduced and an outlet port through which vaporized gas generated by vaporizing the liquid material is discharged; at least one first fixing screw with which at least one of the inlet port or the outlet port is screwed and fixed onto a base; at least one pipe member that is configured to communicate with the fixed port and through which the vaporized gas or the liquid material flows; and at least one second fixing screw with which the at least one pipe member is screwed and fixed onto the fixed port with a seal member interposed between the at least one pipe member and the fixed port.

7 Claims, 10 Drawing Sheets

(51) Int. Cl.
*C23C 16/455* (2006.01)
*C23C 16/52* (2006.01)

(56) References Cited

U.S. PATENT DOCUMENTS

| | | | |
|---|---|---|---|
| 2007/0132231 A1* | 6/2007 | Tokuda | F16L 39/00 |
| | | | 285/124.5 |
| 2007/0166457 A1* | 7/2007 | Yamoto | C23C 16/448 |
| | | | 118/726 |
| 2009/0183792 A1 | 7/2009 | Tokuda et al. | |
| 2010/0186673 A1 | 7/2010 | Tanaka et al. | |
| 2012/0180724 A1 | 7/2012 | Kouketsu et al. | |
| 2014/0020779 A1 | 1/2014 | Vu | |
| 2016/0178193 A1* | 6/2016 | Taguchi | F22D 5/30 |
| | | | 122/451 S |
| 2019/0136370 A1 | 5/2019 | Taguchi et al. | |
| 2023/0134421 A1 | 5/2023 | Taguchi | |

FOREIGN PATENT DOCUMENTS

| | | |
|---|---|---|
| CN | 107413171 A | 12/2017 |
| JP | 2001254900 A | 9/2001 |
| JP | 2003322127 A | 11/2003 |
| JP | 2006009969 A | 1/2006 |
| JP | 3123099 U | 7/2006 |
| JP | 2007078005 A | 3/2007 |
| JP | 2007162734 A | 6/2007 |
| JP | 2011097088 A | 5/2011 |
| JP | 2016122841 A | 7/2016 |
| TW | 200720560 A | 6/2007 |
| TW | 201630054 A | 8/2016 |
| TW | 201920761 A | 6/2019 |
| WO | 0005430 A1 | 2/2000 |
| WO | 2008062679 A | 5/2008 |

OTHER PUBLICATIONS

China National Intellectual Property Administration, Office Action and Search Report Issued in Application No. 202180020221.3, Aug. 14, 2024, 5 pages.
Taiwan Intellectual Property Office, Office Action and Search Report Issued in Application No. 11320873150, Aug. 28, 2024, 17 pages.
China National Intellectual Property Administration, Office Action and Search Report Issued in Application No. 202180020221.3, Jan. 15, 2024, 19 pages. (Submitted with Translation of Office Action).
European Patent Office, Office Action and Search Report Issued in Application No. 21774706.2, Feb. 22, 2024, 8 pages.

* cited by examiner

VAPORIZATION SYSTEM

TECHNICAL FIELD

The present invention relates to a vaporization system for vaporizing a liquid material.

BACKGROUND ART

Conventionally, a vaporization system for vaporizing a liquid material is used to generate gas used in a semiconductor manufacturing process such as, for example, a film formation process (for example, Patent Literature 1). In general, this vaporization system includes, in a casing, a plurality of units such as a vaporization unit that vaporizes the liquid raw material, and a mass flow controller that controls a flow rate of gas generated through vaporization. The casing is provided with an inlet port through which the liquid material is introduced and an outlet port through which the vaporized gas generated by vaporizing the liquid material is discharged. The inlet port and the outlet port are caused to communicate with pipes of a semiconductor manufacturing line, and thus it is possible to supply the gas at a predetermined flow rate to a process chamber in which the semiconductor manufacturing process is performed.

This vaporization system is often used by being fixed on a base member or the like in a process room. In a conventional method of fixing the vaporization system, as illustrated in FIG. 10, each of the inlet port and the outlet port of a vaporization device is caused to communicate with a corresponding one of internal flow paths formed in the base member. Then, the inlet port and the outlet port are screwed and fixed with seal members interposed therebetween. In this manner, the vaporization device is fixed onto the base member.

CITATION LIST

Patent Literature

Patent Literature 1: JP 2016-122841 A

SUMMARY OF INVENTION

Technical Problems

However, in the conventional method of fixing the vaporization device described above, each common fixing screw is used both for fixing the vaporization device onto the base member and for tightening each seal member. Thus, weight of the vaporization device is applied to each seal member. As a result, non-uniformity may occur in tightening surface pressure applied to the seal members, and thus sealing performance may be reduced.

Therefore, the present invention has been made to solve the above problems, and it is a main object of the present invention to reduce weight of a vaporization device applied to a screw with which a seal member is tightened, and to reduce non-uniformity in tightening surface pressure applied to the seal member, thereby improving sealing performance.

Solution to Problem

That is, a vaporization system according to the present invention includes: a vaporization device that is configured to vaporize a liquid material and that includes an inlet port through which the liquid material is introduced and an outlet port through which vaporized gas generated by vaporizing the liquid material is discharged; at least one first fixing screw with which at least one of the inlet port or the outlet port is screwed and fixed onto a base; at least one pipe member that is configured to communicate with the fixed port and through which the vaporized gas or the liquid material flows; and at least one second fixing screw with which the at least one pipe member is screwed and fixed onto the fixed port with a seal member interposed between the at least one pipe member and the fixed port.

According to this configuration, there are separately provided the screw (the at least one first fixing screw) with which the port and the base are tightened and thus the vaporization device is fixed onto the base, and the screw (the at least one second fixing screw) with which the port and the at least one pipe member are tightened and sealed. Thus, it is possible to cause the at least one first fixing screw to mainly support weight of the vaporization device, and therefore to reduce weight of the vaporization device applied to the at least one second fixing screw used for forming the seal. As a result, it is possible to reduce non-uniformity in tightening surface pressure applied to the seal member by the at least one second fixing screw, therefore improving sealing performance.

A specific configuration of the vaporization system includes the following one. That is, the fixed port includes a mounting surface that is configured to be mounted onto the base, and a pipe member mounting surface onto which the at least one pipe member is configured to be mounted so as to communicate with the pipe member mounting surface. In the fixed port, the mounting surface and the pipe member mounting surface are formed on different surfaces.

In the vaporization system, the pipe member mounting surface is preferably formed on a surface opposite to the mounting surface, in the fixed port.

With this configuration, a user can screw the at least one pipe member onto the port in a posture facing a mounting surface on the base. Thus, it is possible to improve efficiency in mounting the at least one pipe member onto the vaporization device. This effect is more noticeably exhibited when mounting operation is performed in a narrow space, for example, where a plurality of vaporization systems is arranged.

In the vaporization system, each of the inlet port and the outlet port is preferably screwed on the base with a corresponding one of a plurality of first fixing screws, each identical to the at least one first fixing screw. The at least one pipe member preferably includes an inlet-side pipe member that is configured to communicate with the inlet port and through which the liquid material flows, and an outlet-side pipe member that is configured to communicate with the outlet port and through which the vaporized gas flows. Each of the inlet-side pipe member and the outlet-side pipe is preferably screwed on a corresponding one of the ports with a corresponding one of a plurality of second fixing screws, each identical to the at least one second fixing screw, with a corresponding one of seal members interposed between each of the inlet-side pipe member and the outlet-side pipe, and the corresponding one of the ports.

According to this configuration, both the inlet port and the outlet port are screwed onto the base with the plurality of first fixing screws. Thus, it is possible to reduce weight of the vaporization device applied to the plurality of second fixing screws used for forming seals in both the inlet port and the outlet port. Therefore, it is possible to further reduce non-uniformity in tightening surface pressure applied to the seal members by the plurality of second fixing screws, thereby improving sealing performance.

The effects of the present invention become more noticeable as a component of weight of the vaporization device applied to the first fixing screw with respect to the total weight of the vaporization device increases.

An aspect in which the effects of the present invention are more noticeably exhibited is, for example, the following one. That is, the inlet port is provided on one end side of the vaporization device, and the outlet port is provided on the other end side of the vaporization device. Then, the vaporization device is fixed on the base in a state where the inlet port and the outlet port are positioned one below the other or vice versa in a vertical direction.

An aspect in which the effects of the present invention are further noticeably exhibited is the following one. That is, the respective mounting surfaces of the inlet port and the outlet port are formed so as to be parallel to the vertical direction.

In the vaporization system, the at least one pipe member preferably includes at least one external pipe, and at least one communication member through which the at least one external pipe and the fixed port are caused to communicate with each other. The at least one communication member preferably has one end that is screwed on the fixed port and the other end that is screwed on the at least one external pipe.

With this configuration, the at least one pipe member includes the plurality of component members. Thus, it is possible to increase a degree of freedom in designing the at least one pipe member.

The effects of the present invention described above become more noticeable as the weight of the vaporization device increases.

An aspect in which the effects of the present invention are more noticeably exhibited is, for example, the following one. That is, the vaporization device includes a vaporizer that is configured to vaporize the liquid material, and a supply rate controller that is configured to control a supply rate of the liquid material to the vaporizer.

Another aspect in which the effects of the present invention are more noticeably exhibited is, for example, the following one. That is, the vaporization device further includes a mass flow controller that is configured to control a flow rate of vaporized gas generated by vaporizing in the vaporizer.

A method of fixing a vaporization device according to the present invention is a method of fixing, onto a base, a vaporization device that is configured to vaporize a liquid material and that includes an inlet port through which the liquid material is introduced and an outlet port through which vaporized gas generated by vaporizing the liquid material is discharged. The method includes: screwing and fixing at least one of the inlet port or the outlet port onto a base; and screwing and fixing, onto the fixed port, at least one pipe member that is configured to communicate with the fixed port and through which the vaporized gas or the liquid material flows, with a seal member interposed between the at least one pipe member and the fixed port.

According to the method of fixing the vaporization device, it is possible to achieve the same operation and effects as those in the vaporization system according to the present invention, which has been described above.

Advantageous Effects of Invention

According to the present invention configured as described above, it is possible to reduce weight of a vaporization device applied to a screw with which a seal member is tightened, and to reduce non-uniformity in tightening surface pressure applied to the seal member, therefore improving sealing performance.

Figure 1:
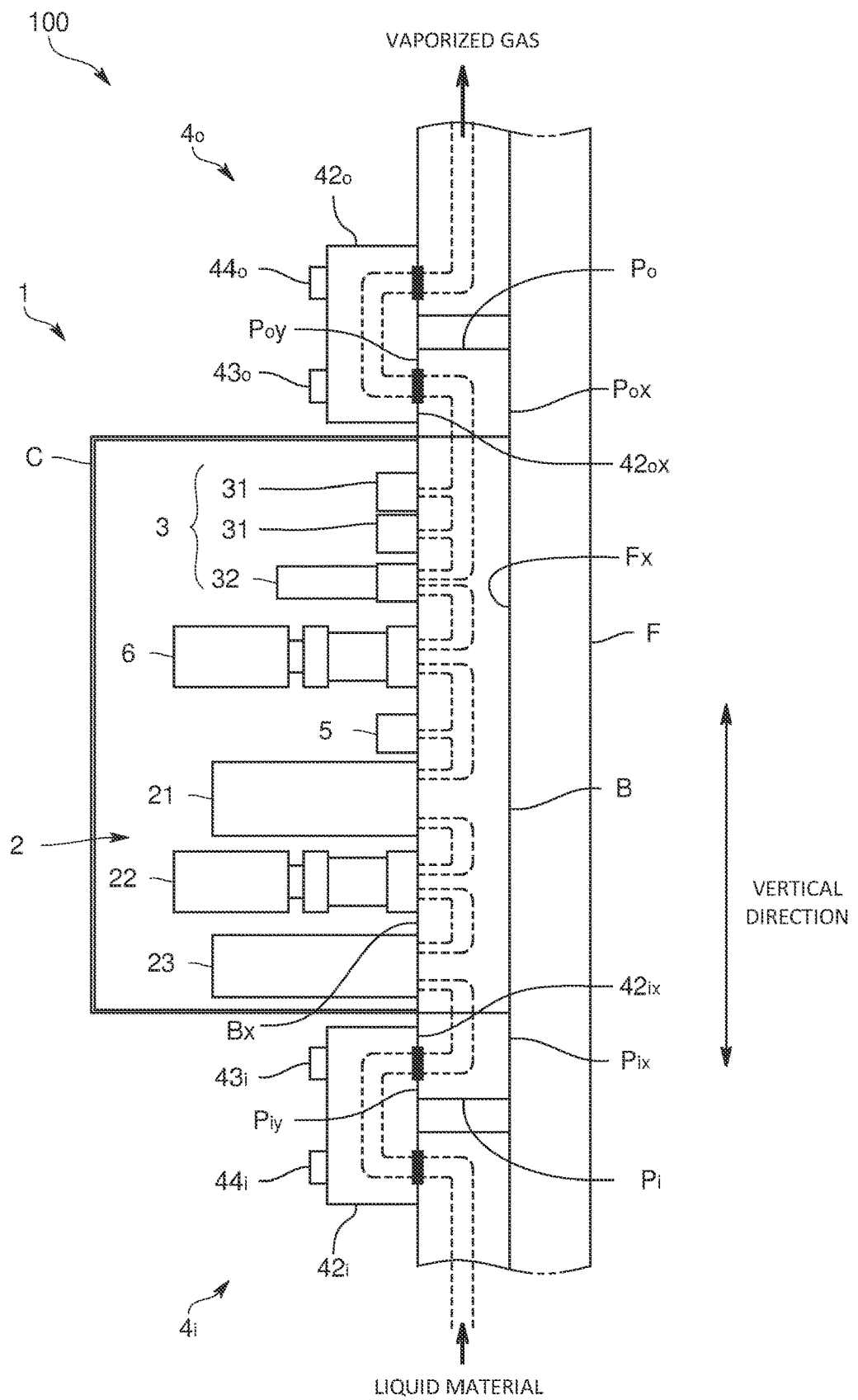
FIG. 1 is a schematic view illustrating a configuration of a vaporization system according to the present embodiment.

LIST OF REFERENCE CHARACTERS 100 vaporization system
1 vaporization device
$41_i$, $41_o$ first fixing screw
$42_i$ inlet-side pipe member
$42_o$ outlet-side pipe member
$43i$, $43_o$ second fixing screw
F base member
S seal member
$P_I$ inlet port
$P_O$ outlet port
B main body block

DESCRIPTION OF EMBODIMENTS

Hereinafter, an embodiment of a vaporization system according to the present invention will be described with reference to the drawings.

A vaporization system 100 according to the present embodiment is used for supplying gas at a predetermined flow rate to a process chamber, which is incorporated, for example, on a semiconductor manufacturing line or the like, and in which a semiconductor manufacturing process is performed. Specifically, the vaporization system 100 includes a vaporization device 1 that vaporizes a liquid material, and a connection mechanism 4 that fixes the vaporization device 1 on a base member F and that connects the vaporization device 1 to the semiconductor manufacturing line.

Figure 2:
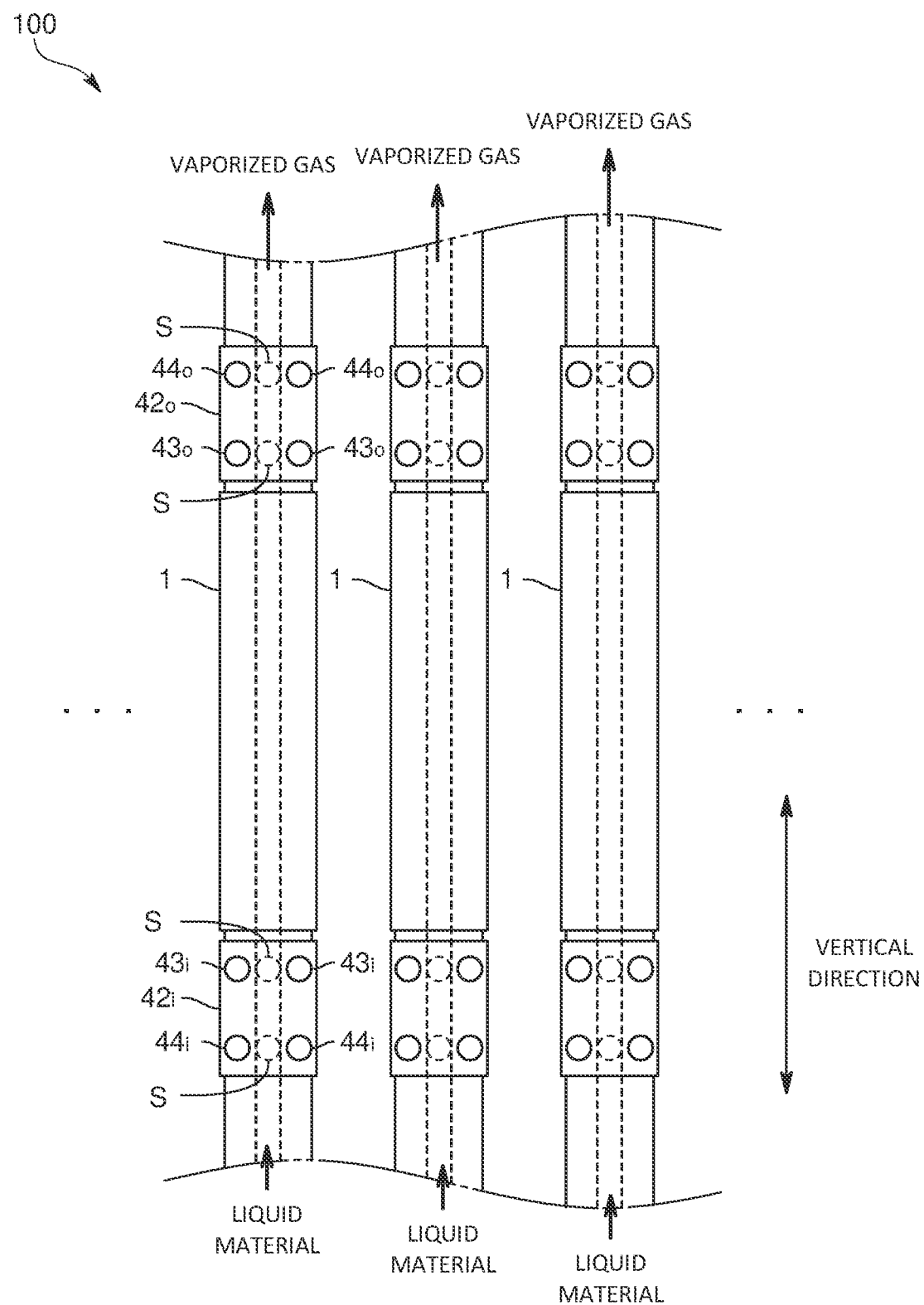
FIG. 2 is a plan view illustrating the configuration of the vaporization system according to the embodiment, as viewed toward a device mounting surface.

As illustrated in FIG. 1, the vaporization device 1 includes a vaporization unit 2 that vaporizes the liquid raw material, and a mass flow controller 3 that controls a flow rate of gas generated through vaporization in the vaporization unit 2. The vaporization device 1 includes a casing C having a substantially pillar shape (specifically, a substantially rectangular parallelepiped shape) and having a longitudinal direction. The casing C houses the vaporization unit 2 and the mass flow controller 3. An inlet port $P_i$ through which the liquid material is introduced is provided on one end side in the longitudinal direction of the casing C. An outlet port $P_o$ through which the vaporized gas is discharged is provided on the other end side in the longitudinal direction of the casing C. As illustrated in FIG. 2, in the vaporization system 100 according to the present embodiment, a plurality of vaporization devices 1 is provided. The plurality of vaporization devices 1 is fixed side by side so as to stand on a device mounting surface Fx of the base member F.

The vaporization unit 2 includes a vaporizer 21, a supply flow rate controller 22, and a preheater 23. The vaporizer 21 vaporizes the liquid material using a baking method. The supply flow rate controller 22 controls a supply rate of the liquid material to the vaporizer 21. The preheater 23 preheats the liquid material supplied to the vaporizer 21 to a predetermined temperature.

The vaporizer 21, the supply flow rate controller 22, and the preheater 23 are mounted on a unit mounting surface Bx set on one surface of a main body block B, which is a manifold block and in which flow paths are formed. Herein, the main body block B is made of metal such as stainless steel, for example. The main body block B has a substantially pillar shape (specifically, a substantially rectangular parallelepiped shape) and has a longitudinal direction. The unit mounting surface Bx is a surface having a rectangular shape and having a longitudinal direction. The main body block B is mounted on the casing C while the longitudinal direction of the main body block B faces the longitudinal direction of the casing C.

Specifically, the preheater 23, the supply flow rate controller 22, and the vaporizer 21 are mounted on the unit mounting surface Bx while being arranged in a line along the longitudinal direction. The preheater 23, the supply flow rate controller 22, and the vaporizer 21 are connected in series in this order from an upstream side, through the internal flow paths formed in the main body block B. An upstream side opening of the internal flow path of the main body block B is connected to the liquid material inlet port $P_i$ provided on a surface of one end in the longitudinal direction of the main body block B.

The vaporizer 21 includes a storage container and a vaporization heater (not illustrated). The storage container is a vaporization tank having a space for storing the liquid material therein. The vaporization heater is provided in the storage container, and is used for vaporizing the liquid material.

The supply flow rate controller 22 is a control valve that controls a supply flow rate of the liquid material to the vaporizer 21, and is specifically an electromagnetic on-off valve. A controller (not illustrated) controls (for example, performs on/off control of) the electromagnetic on-off valve 22 based on a detection signal from a liquid level sensor provided in the storage container of the vaporizer 21. The control is performed such that the liquid material stored in the storage container is maintained constantly at a predetermined volume. As a result, the liquid material is intermittently supplied to the vaporizer 21.

The preheater 23 is configured to heat the liquid material to a temperature immediately prior to vaporization (a temperature just lower than a boiling point) by using a preheating heater (not illustrated).

With the vaporization unit 2 configured as described above, the liquid material introduced from the liquid material inlet port $P_i$ is preheated to a predetermined temperature as a result of flowing through a flow path in the preheater 23. The liquid material preheated by the preheater 23 is intermittently introduced into the vaporizer 21 by the control of the electromagnetic on-off valve 22, which serves as a supply rate controller. Then, in the vaporizer 21, a state is achieved in which the liquid material is constantly stored therein, and the liquid material is vaporized, so that vaporized gas is continuously generated by the vaporization, without being affected by the control of the electromagnetic on-off valve 22. The vaporized gas is then continuously discharged to the mass flow controller 3.

Next, the mass flow controller 3 will be described.

The mass flow controller 3 includes fluid detectors 31 that detect the vaporized gas flowing through the flow path, and a flow rate control valve 32 that controls a flow rate of the vaporized gas flowing through the flow path. Each of the fluid detectors 31 is, for example, a capacitance type pressure sensor, and detects a corresponding one of respective pressures on an upstream side and a downstream side of a fluid resistor provided in the flow path. The flow rate control valve 32 is a control valve that controls the flow rate of the vaporized gas generated in the vaporizer 21, and is a piezo valve in the present embodiment.

The fluid detectors 31 and the flow rate control valve 32 are mounted on the unit mounting surface Bx. Specifically, the flow rate control valve 32 and the fluid detectors 31 are mounted on the unit mounting surface Bx while being arranged in a line along the longitudinal direction thereof. The flow rate control valve 32 and the fluid detectors 31 are connected in series in this order from the upstream side, through the internal flow path formed in the main body block B.

In the present embodiment, an upstream-side pressure sensor 5 and an on-off valve 6 are provided on the upstream side of the mass flow controller 3. A downstream side opening of the internal flow path of the main body block B is connected to the vaporized gas outlet port $P_o$ provided on a surface of the other end in the longitudinal direction of the main body block B.

The connection mechanism 4 fixes the vaporization device 1 on the device mounting surface Fx of the base member F. The fixation is made in a state where the longitudinal direction of the vaporization device 1 faces the upper-lower direction (vertical direction), and the inlet port $P_i$ and the outlet port $P_o$ are positioned one below the other (herein, the inlet port $P_i$ is positioned on a lower side of the outlet port $P_o$, and the outlet port $P_o$ is positioned on an upper side of the inlet port $P_i$. Herein, the device mounting surface Fx is formed on the base member F so as to be parallel to the vertical direction.

Figure 3:
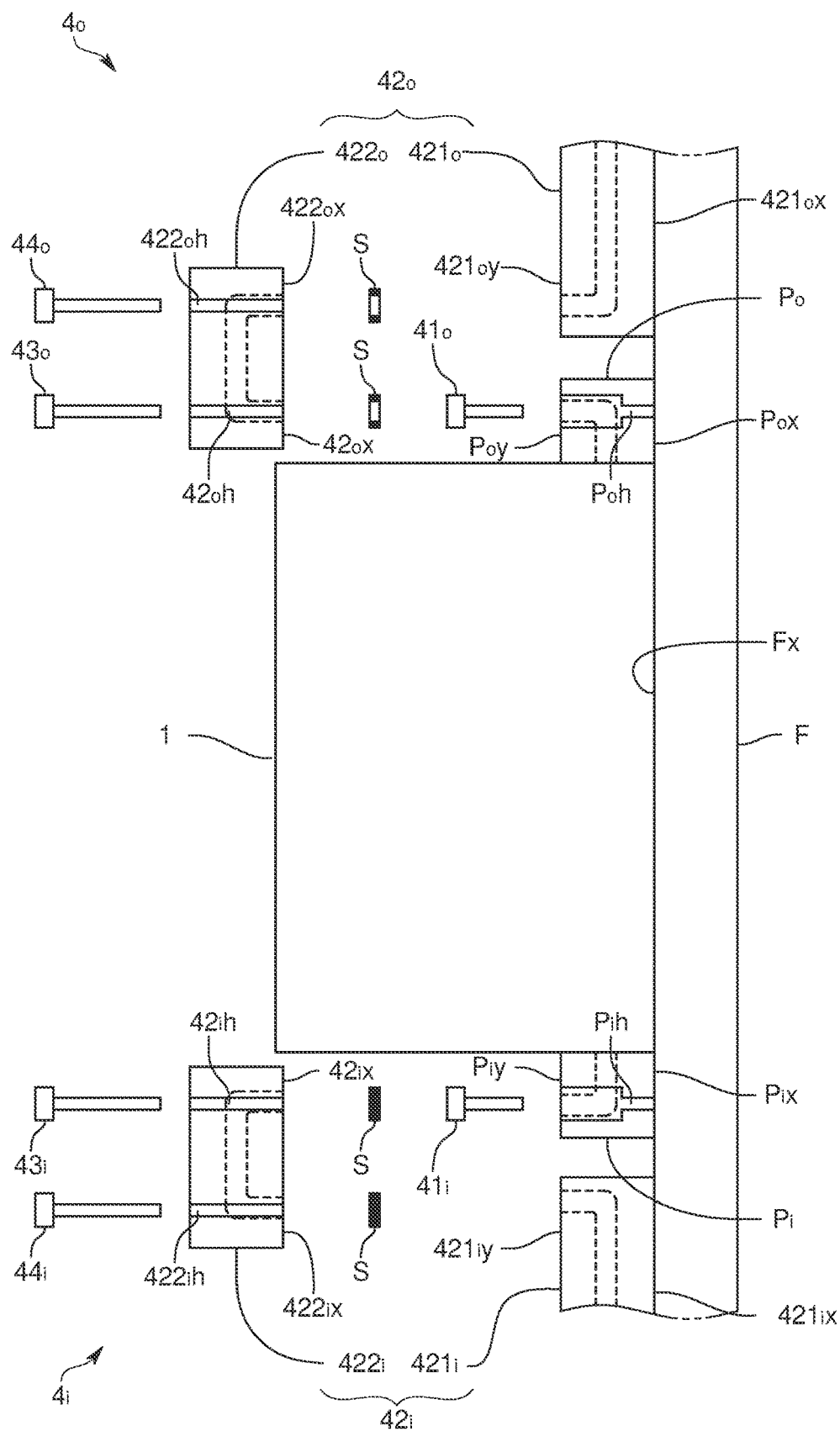
FIG. 3 is an exploded view illustrating the vaporization system according to the embodiment.

Specifically, as illustrated in FIG. 3, the connection mechanism 4 includes first fixing screws 41, an inlet-side pipe member $42_i$, an outlet-side pipe member $42_o$, and second fixing screws 43. With the first fixing screws 41, the inlet port $P_i$ and the outlet port $P_o$ are screwed and fixed onto the base member F. The inlet-side pipe member $42_i$ communicates with the inlet port $P_i$ and includes an internal flow path, formed therein, through which the liquid material flows. The outlet-side pipe member $42_o$ communicates with the outlet port $P_o$ and includes an internal flow path, formed therein, through which the vaporized gas flows. With the second fixing screws 43, each of the inlet-side pipe member $42_i$ and the outlet-side pipe member $42_o$ is screwed and fixed onto a corresponding one of the ports with a corresponding one of seal members S interposed therebetween.

Each of the inlet port $P_i$ and the outlet port $P_o$ has a block shape in which an internal flow path is formed. The inlet port $P_i$ and the outlet port $P_o$ include mounting surfaces $P_ix$, $P_ox$, respectively. The mounting surfaces $P_ix$, $P_ox$ are to be mounted on the device mounting surface Fx of the base member F. In the inlet port $P_i$, through-holes $P_ih$ are formed, and in the outlet port $P_o$, through-holes $P_oh$ are formed. The through-holes $P_ih$ penetrate from the mounting surface $P_ix$ toward a surface opposite thereto, and the through-holes $P_oh$ penetrate from the mounting surface $P_ox$ toward a surface opposite thereto. The first fixing screws 41 are inserted into the through-holes $P_ih$, $P_oh$ such that the insertion is made from the respective surfaces, on the ports $P_i$, $P_o$, opposite to the mounting surfaces $P_ix$, $P_ox$. Then, tips of the first fixing screws 41 are screwed into screw holes formed on the device mounting surface Fx of the base member F. With this screwing, tightening is performed between each of the respective mounting surfaces $P_ix$, $P_ox$ of the ports $P_i$, $P_o$, and the device mounting surface Fx of the base member F. Herein, the through-holes $P_ih$, $P_oh$ and the screw holes are formed such that the first fixing screws 41 are screwed in a manner orthogonal to the mounting surface Fx of the base member F.

In the inlet port $P_i$ and the outlet port $P_o$, pipe member mounting surfaces $P_iy$, $P_oy$ are formed, respectively. The pipe member mounting surfaces $P_iy$, $P_oy$ are formed on respective surfaces different from the mounting surfaces $P_ix$, $P_ox$. A corresponding one of the pipe members is to be mounted onto each of the pipe member mounting surfaces $P_iy$, $P_oy$ so as to communicate therewith. Herein, the respective pipe member mounting surfaces $P_iy$, $P_oy$ of the ports $P_i$, $P_o$ are formed on the respective surfaces opposite to the mounting surfaces $P_ix$, $P_ox$. An inlet opening, through which the liquid material is introduced, is formed on the pipe member mounting surface $P_iy$ of the inlet port $P_i$. An outlet opening, through which the vaporized gas is discharged, is formed on the pipe member mounting surface $P_oy$ of the outlet port $P_o$.

The inlet-side pipe member $42_i$ and the outlet-side pipe member $42_o$ are configured such that the internal flow paths thereof extend in the upper-lower direction along the device mounting surface Fx of the base member F. The pipe members $42_i$, $42_o$ have respective first mounting surfaces $42_ix$, $42_ox$ to be mounted on the respective pipe member mounting surfaces $P_iy$, $P_oy$ of the corresponding, respective ports. One end of the internal flow path is opened on each of the first mounting surfaces $42_ix$, $42_ox$. A configuration is made such that when the respective first mounting surfaces $42_ix$, $42_ox$ of the pipe members $42_i$, $42_o$ are mounted onto the respective pipe member mounting surfaces $P_iy$, $P_oy$ of the corresponding, respective ports, each of the internal flow paths communicates with a corresponding one of the inlet opening and the outlet opening.

In the inlet-side pipe member $42_i$, through-holes $42_ih$ are formed, and in the outlet-side pipe member $42_o$, through-holes $42_oh$ are formed. The through-holes $42_ih$ penetrate from the first mounting surface $42_ix$ toward a surface opposite thereto, and the through-holes $42_oh$ penetrate from the first mounting surface $42_ox$ toward a surface opposite thereto. The second fixing screws 43 are inserted into the through-holes $42_ih$, $42_oh$ such that the insertion is made from the respective surfaces, in the pipe members $42_i$, $42_o$, opposite to the first mounting surfaces $42_ix$, $42_ox$. Then, tips of the second fixing screws 43 are screwed into screw holes, formed on the respective pipe member mounting surfaces $P_iy$, $P_oy$ of the corresponding ports $P_i$, $P_o$. With this screwing, tightening and sealing are performed between each of the respective first mounting surfaces $42_ix$, $42_ox$ of the pipe members $42_i$, $42_o$, and the corresponding one of the respective pipe member mounting surfaces $P_iy$, $P_oy$ of the ports $P_i$, $P_o$, with a corresponding one of the seal members S interposed therebetween. Herein, the through-holes $42_ih$, $42_oh$ and the screw holes are formed such that the second fixing screws 43 are screwed in a manner orthogonal to the device mounting surface Fx of the base member F.

In the present embodiment, each of the inlet-side pipe member $42_i$ and the outlet-side pipe member $42_o$ includes a plurality of component members. Specifically, as illustrated in FIG. 3, the inlet-side pipe member $42_i$ includes an inlet-side external pipe $421_i$, and an inlet-side communication member $422_i$. The inlet-side external pipe $421_i$, communicates with a liquid supply line through which the liquid material flows. Through the inlet-side communication member $422_i$, the inlet-side external pipe $421_i$, and the inlet port $P_i$ are caused to communicate with each other. The outlet-side pipe member $42_o$ includes an outlet-side external pipe $421_o$ and an outlet-side communication member $422_o$. The outlet-side external pipe $421_o$ communicates with the process chamber. Through the outlet-side communication member $422_o$, the outlet-side external pipe $421_o$ and the outlet port $P_o$ are caused to communicate with each other.

Each of the external pipes $421_i$, $421_o$ has a pillar shape in which an internal flow path is formed, and is mounted on the device mounting surface Fx of the base member F such that each of the internal flow paths faces the vertical direction. The external pipes $421_i$, $421_o$ have respective communication member mounting surfaces $421_iy$, $421_oy$, formed on respective surfaces opposite to mounting surfaces $421_ix$, $421_ox$, which are to be mounted to the base member F. A corresponding one of the communication members is to be mounted onto each of the communication member mounting surfaces $421_iy$, $421_oy$. One end of the internal flow path is opened on each of the communication member mounting surfaces $421_iy$, $421_oy$.

Each of the communication members $422_i$, $422_o$ has a block shape in which an internal flow path is formed. The communication members $422_i$, $422_o$ have the first mounting surfaces $42_ix$, $42_ox$ described above, and second mounting surfaces $422_ix$, $422_ox$, respectively. The second mounting surfaces $422_ix$, $422_ox$ are to be mounted onto the respective communication member mounting surfaces $421_iy$, $421_oy$ of the corresponding, respective external pipes. Herein, the first mounting surface $42_ix$ and the second mounting surface $422_ix$ are formed at different positions within the same surface in the communication member $422_i$ while the first mounting surface $42_ox$ and the second mounting surface $422_ox$ are formed at different positions within the same surface in the communication member $422_o$. The one end of the internal flow path is opened on each of the first mounting surfaces $42_ix$, $42_ox$. The other end of the internal flow path is opened on each of the second mounting surfaces $422_ix$, $422_ox$. Thus, a configuration is made such that when the respective first mounting surfaces $42_ix$, $42_ox$ of the communication members $422_i$, $422_o$ are mounted onto the corresponding, respective pipe member mounting surfaces $P_iy$, $P_oy$ of the corresponding ports $P_i$, $P_o$, each of the respective internal flow paths of the communication members communicates with the corresponding one of the inlet opening of the port $P_i$ and the outlet opening of the port $P_o$. Then, the configuration is also made such that when the second mounting surfaces $422_ix$, $422_ox$ are mounted to the respective communication member mounting surfaces $421_iy$, $421_oy$ of the corresponding, respective external pipes $421_i$, $421_o$, each of the respective internal flow paths formed in the communication members $422_i$, $422_o$ communicates with the corresponding one of the respective internal flow paths formed in the external pipes $421_i$, $421_o$.

Herein, the connection mechanism 4 further includes third fixing screws 44, with which each of the inlet-side communication member $422_i$ and the outlet-side communication member $422_o$ is screwed and fixed onto the corresponding one of the external pipes $421_i$, $421_o$, with a corresponding one of seal members S interposed therebetween.

In the inlet-side communication member $422_i$, through-holes $422_i$h are formed, and in the outlet-side communication member $422_o$, through-holes $422_o$h are formed. The through-holes $422_i$h penetrate from the second mounting surface $422_i$x toward a surface opposite thereto, and the through-holes $422_o$h penetrate from the second mounting surface $422_o$x toward a surface opposite thereto. The third fixing screws 44 are inserted into the through-holes $422_i$h, $422_o$h such that the insertion is made from the respective surfaces, on the communication members $422_i$, $422_o$, opposite to the second mounting surfaces $422_i$x, $422_o$x. Then, tips of the third fixing screws 44 are screwed into screw holes, formed on the respective communication member mounting surfaces $421_i$y, $421_o$y of the corresponding external pipes $421_i$, $421_o$. With this screwing, tightening and sealing are performed between each of the respective second mounting surfaces $422_i$x, $422_o$x of the communication members $422_i$, $422_o$, and a corresponding one of the respective communication member mounting surfaces $421_i$y, $421_o$y of the external pipes $421_i$, $421_o$, with the corresponding one of the seal members S interposed therebetween. The through-holes $422_i$h, $422_o$h and the screw holes are formed such that the third fixing screws 44 are screwed in a manner orthogonal to the device mounting surface Fx of the base member F.

According to the vaporization system 100 in accordance with the present embodiment configured as described above, there are separately provided the first fixing screws 41 with which the ports $P_i$, $P_o$ and the base member F are tightened and thus the vaporization device 1 is fixed onto the base, and the second fixing screws 43 with which each of the ports $P_i$, $P_o$ and the corresponding one of the pipe members $42_i$, $42_o$ are tightened and sealed. Thus, it is possible to cause the first fixing screws 41 to mainly support weight of the vaporization device 1, and therefore to reduce weight of the vaporization device 1 applied to the second fixing screws 43 used for forming the seals. As a result, it is possible to reduce non-uniformity in tightening surface pressure applied to the seal members S by the second fixing screws 43, thereby improving sealing performance.

The present invention is not limited to the above embodiment.

Figure 4:
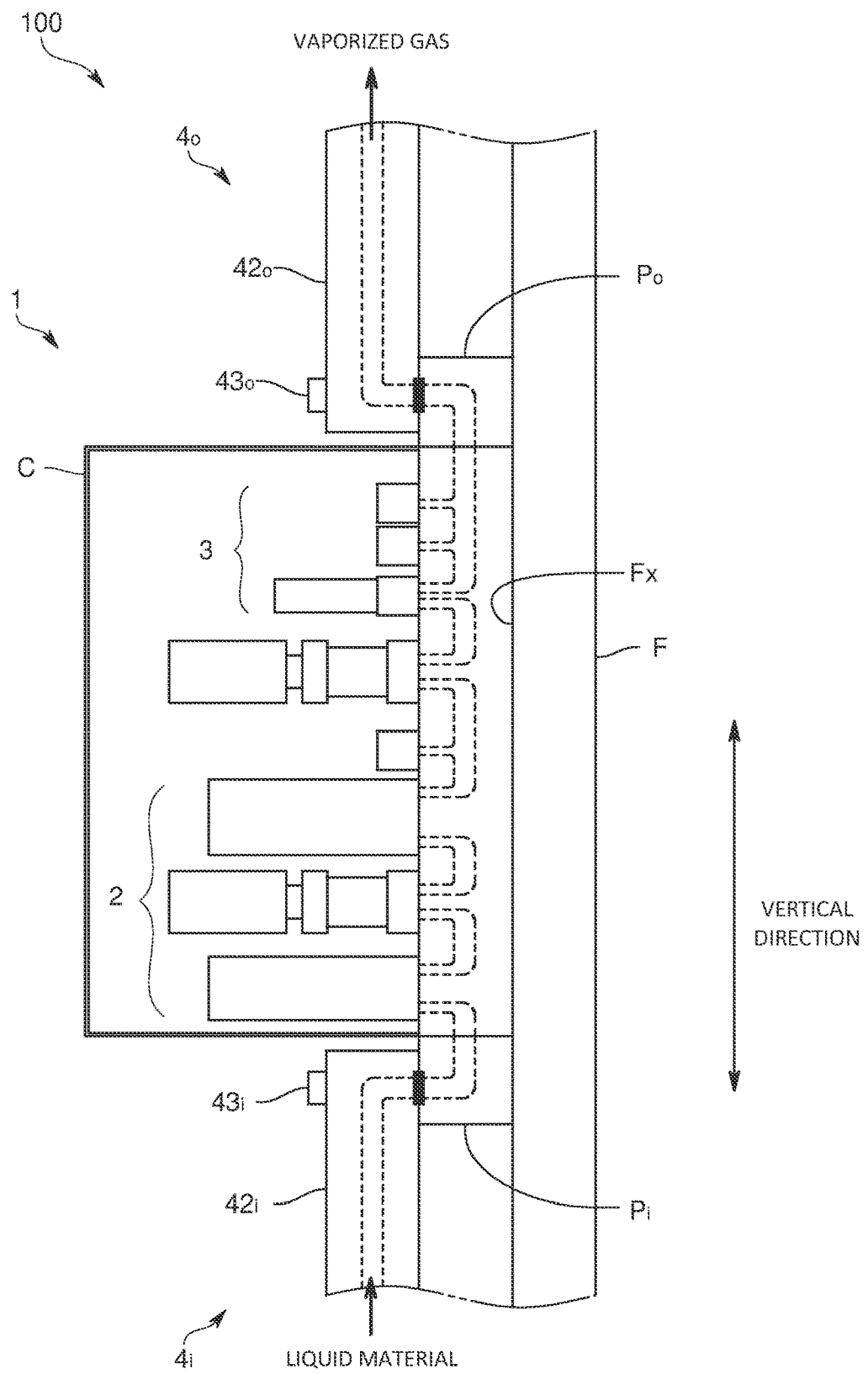
FIG. 4 is a schematic view illustrating a configuration of a vaporization system according to another embodiment.

For example, in the vaporization system 100 according to the above embodiment, each of the inlet-side pipe member $42_i$ and the outlet-side pipe member $42_o$ includes the plurality of component members. However, the present invention is not limited to this configuration. In a vaporization system 100 according to another embodiment, each of the inlet-side pipe member $42_i$ and the outlet-side pipe member $42_o$ may be formed of a single component member, as illustrated in FIG. 4.

In the vaporization system 100 according to the above embodiment, the pipe member mounting surfaces $P_i$y, $P_o$y are formed on the respective surfaces opposite to the respective mounting surfaces $P_i$x, $P_o$x, in the inlet port $P_i$ and the outlet port $P_o$. However, the present invention is not limited to this configuration. Each of the pipe member mounting surfaces $P_i$y, $P_o$y may be formed at any position, as long as each of the pipe member mounting surfaces $P_i$y, $P_o$y is formed at a position different from a position of the corresponding one of the mounting surfaces $P_i$x, $P_o$x.

Figure 5:
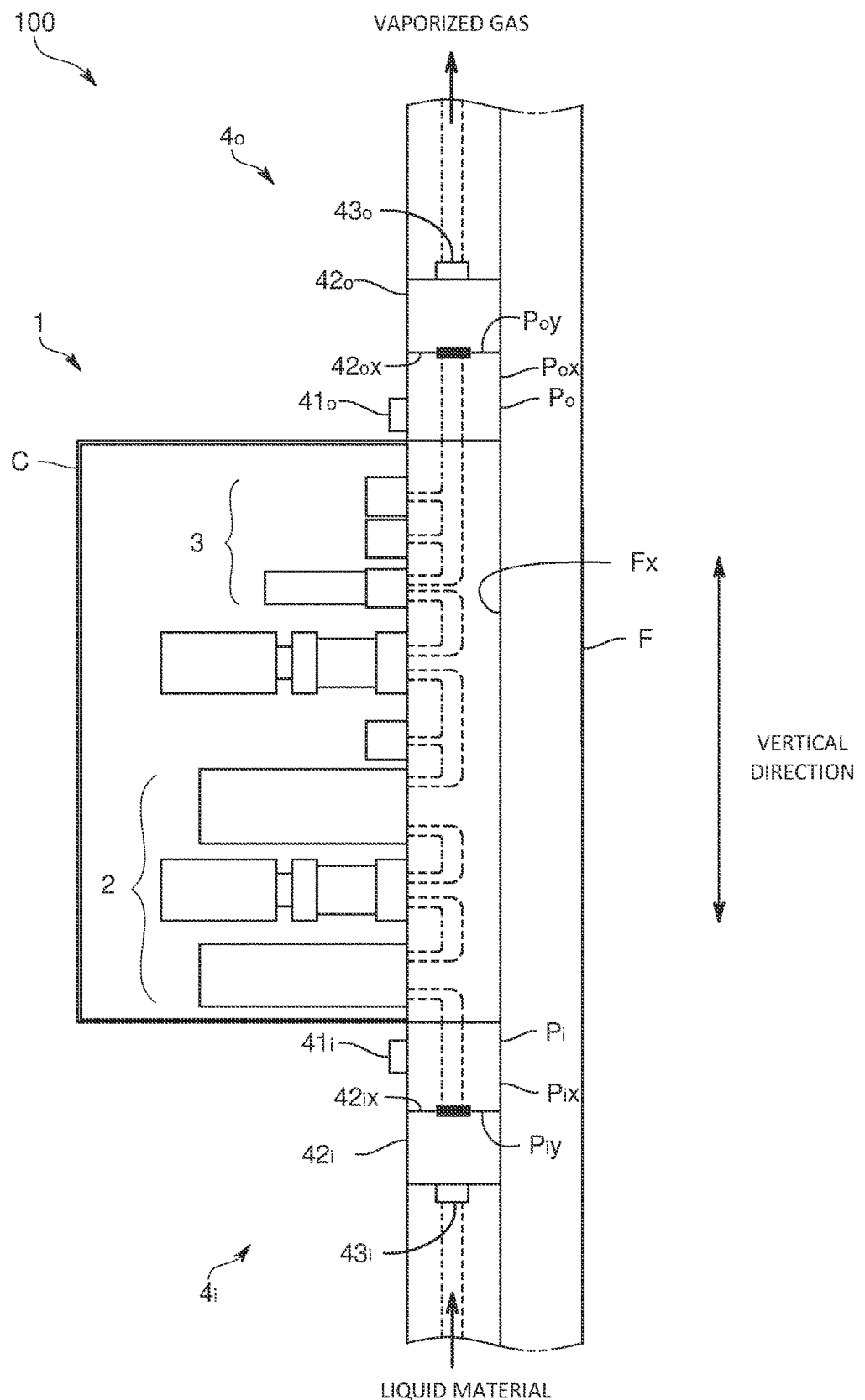
FIG. 5 is a schematic view illustrating a configuration of a vaporization system according to still another embodiment.
Figure 6:
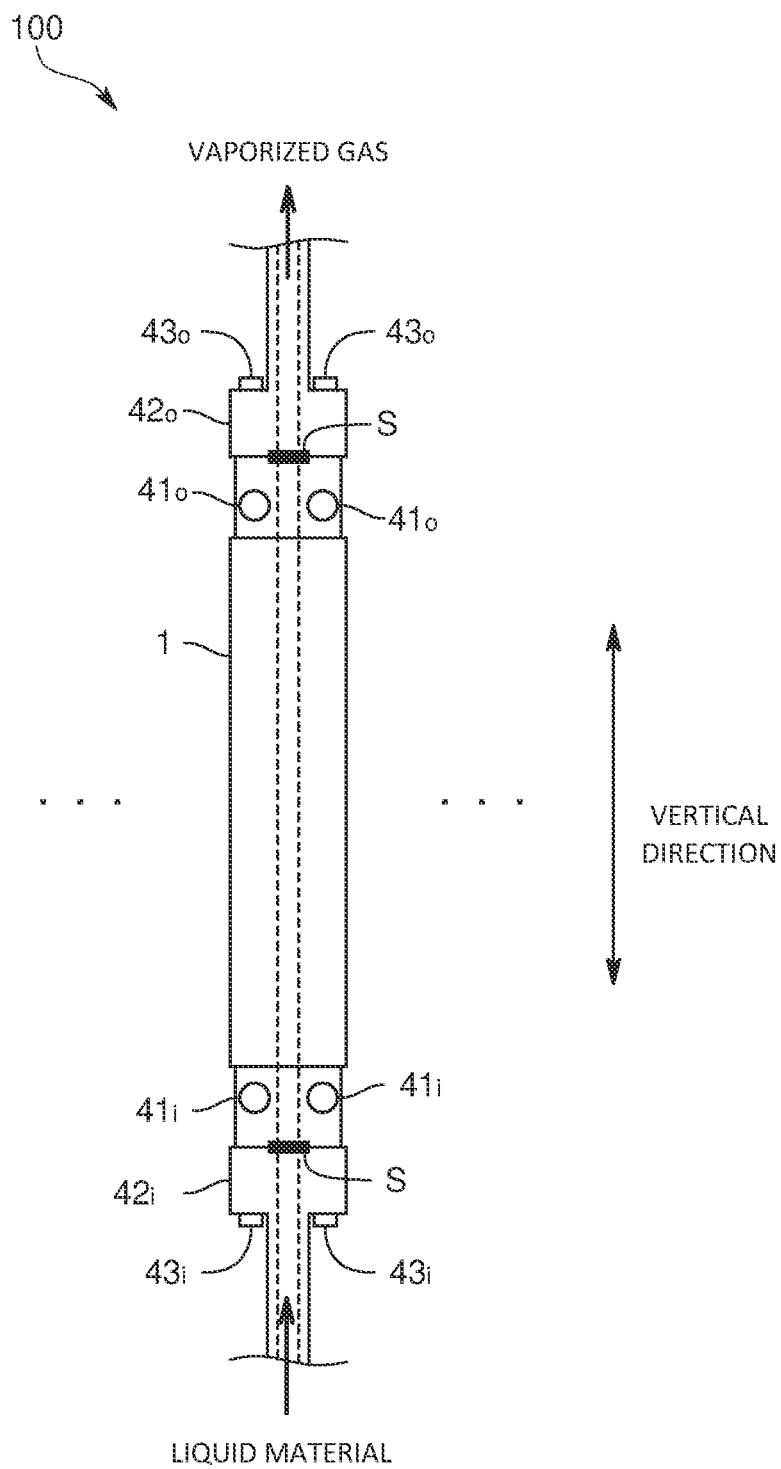
FIG. 6 is a plan view illustrating the configuration of the vaporization system according to the still other embodiment, as viewed toward a device mounting surface.
Figure 7:
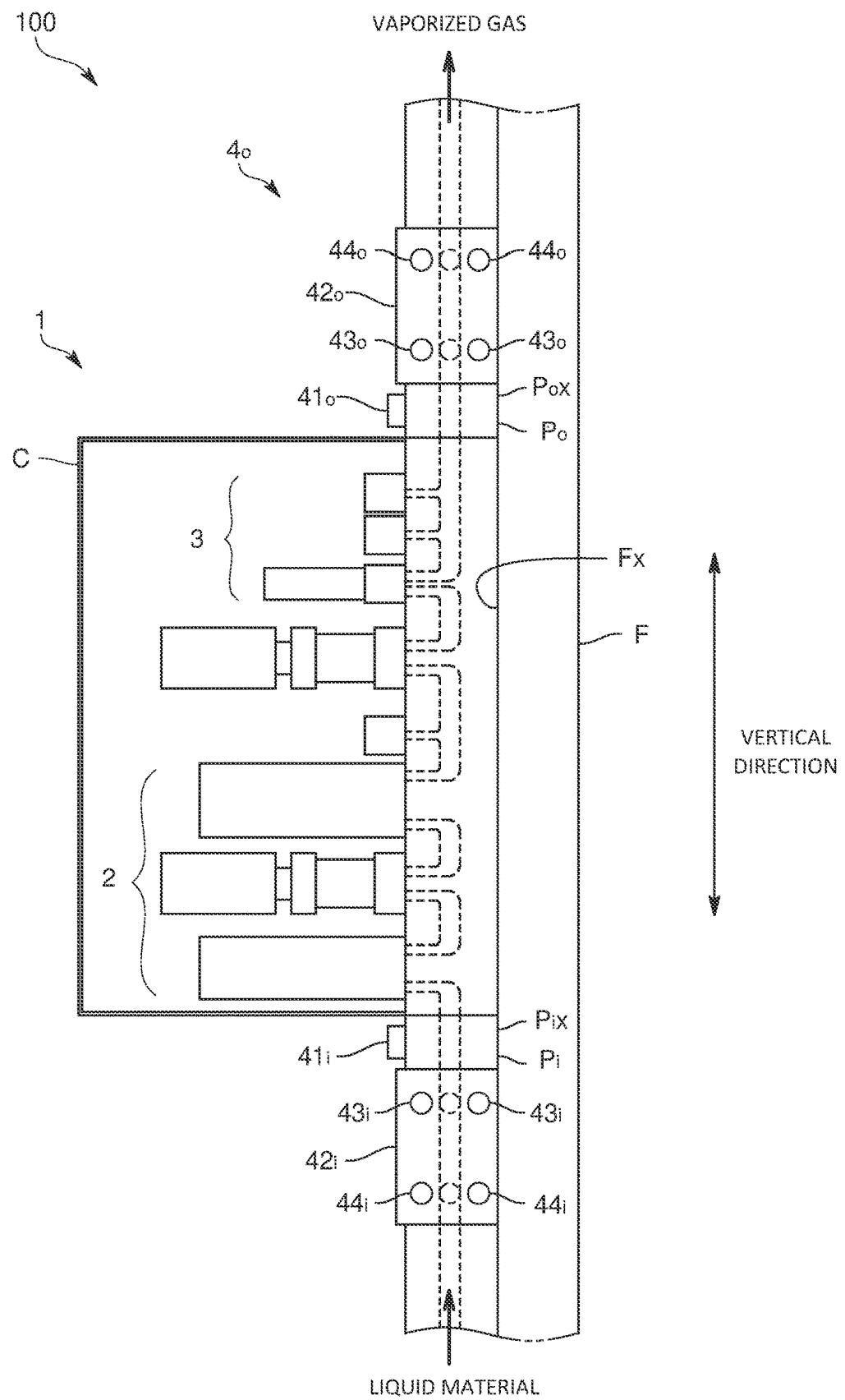
FIG. 7 is a schematic view illustrating another configuration of the vaporization system according to the still other embodiment.
Figure 8:
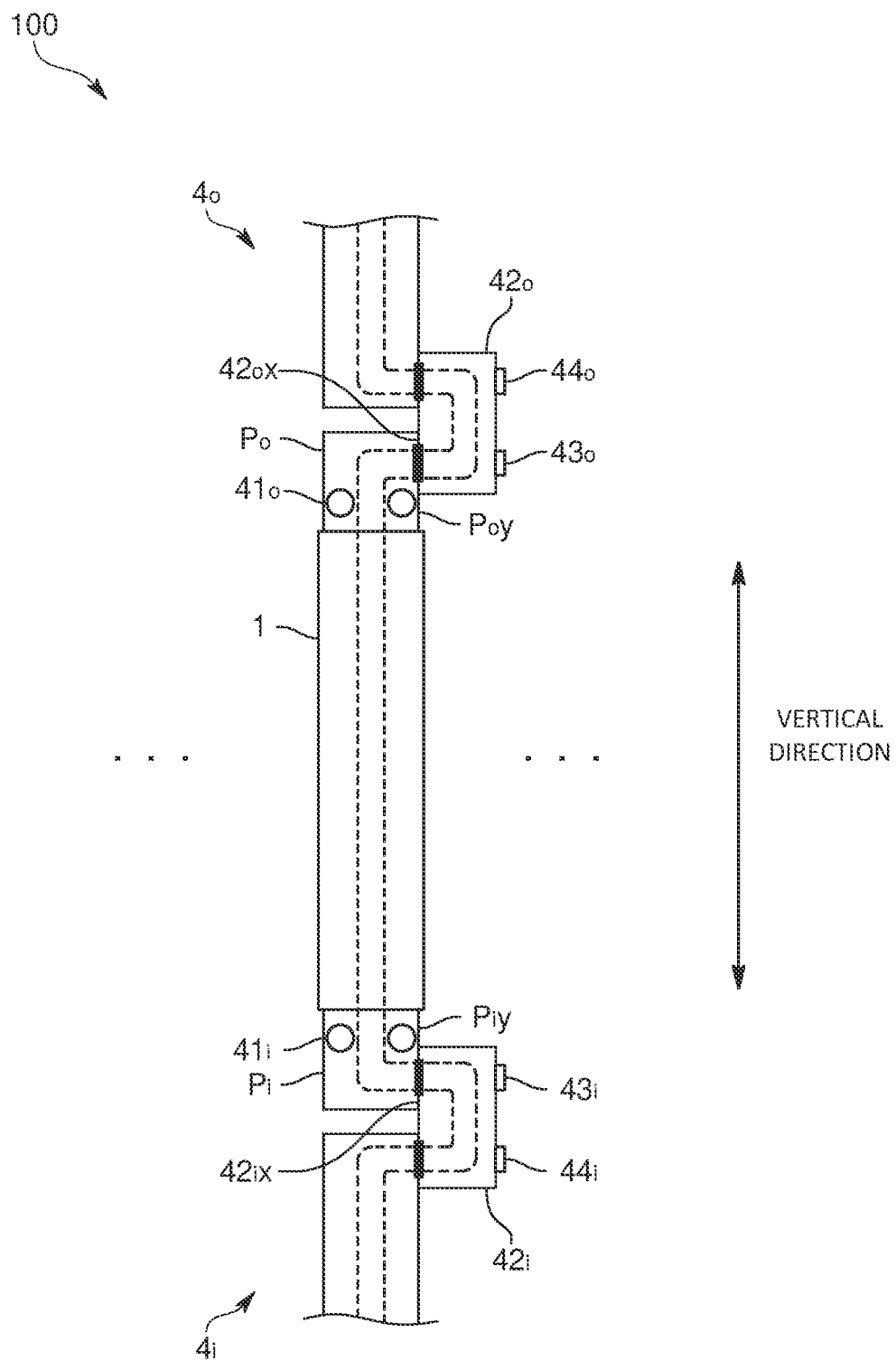
FIG. 8 is a plan view illustrating the other configuration of the vaporization system according to the still other embodiment, as viewed toward the device mounting surface.

For example, in a vaporization system 100 according to still another embodiment, the pipe member mounting surfaces $P_i$y, $P_o$y may be formed so as to intersect (for example, be orthogonal to) the mounting surfaces $P_i$x, $P_o$x, in the inlet port $P_i$ and the outlet port $P_o$, respectively. Specifically, the pipe member mounting surfaces $P_i$y, $P_o$y may be formed so as to intersect the mounting surfaces $P_i$x, $P_o$x, respectively, and so as to intersect the longitudinal direction of the vaporization device 1, as illustrated in FIGS. 5 and 6. Alternatively, the pipe member mounting surfaces $P_i$y, $P_o$y may be formed so as to intersect the mounting surfaces $P_i$x, $P_o$x, respectively, and so as to be parallel to the longitudinal direction of the vaporization device 1, as illustrated in FIGS. 7 and 8.

Figure 9:
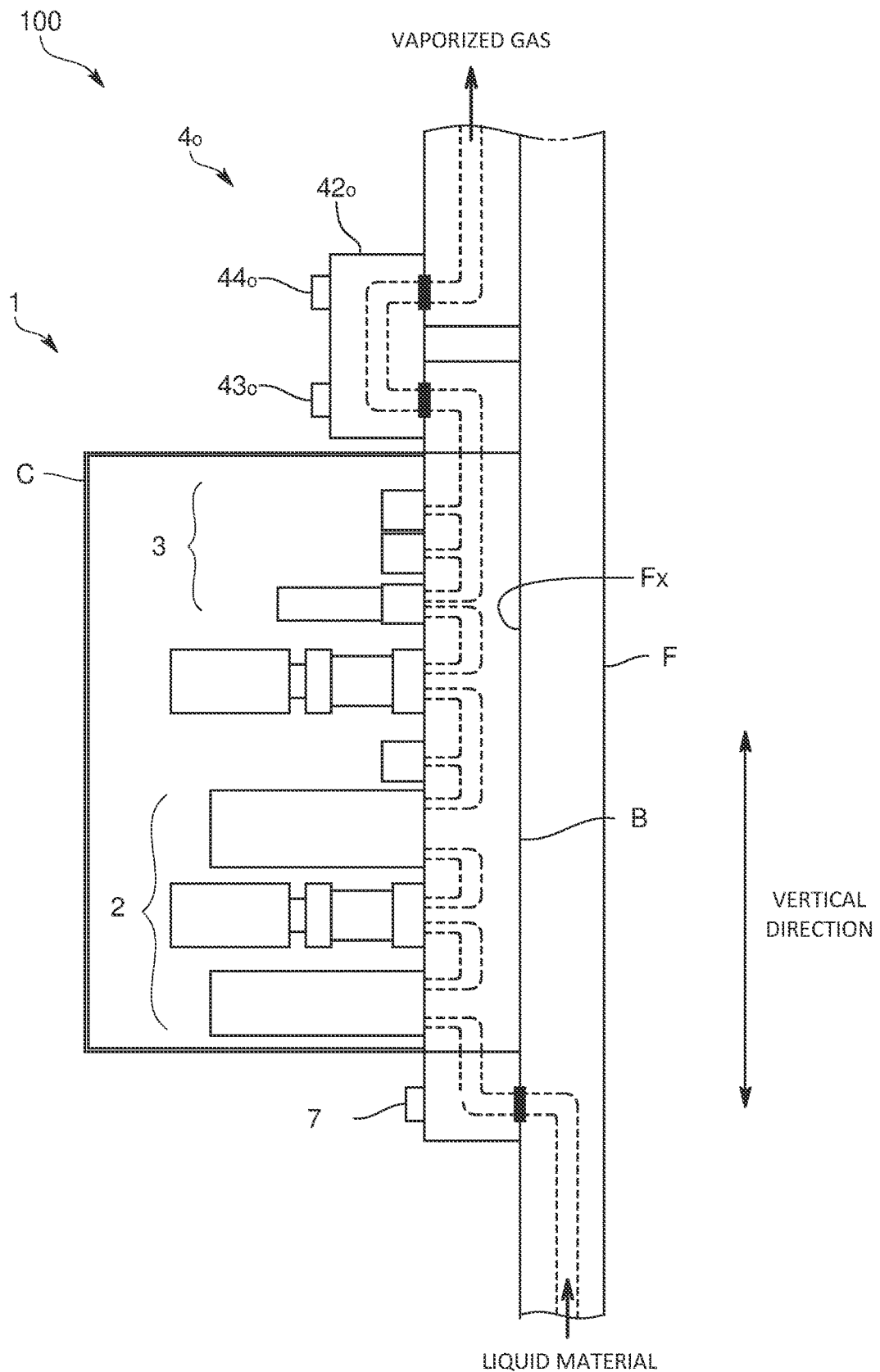
FIG. 9 is a schematic view illustrating a configuration of a vaporization system according to yet another embodiment.
Figure 10:
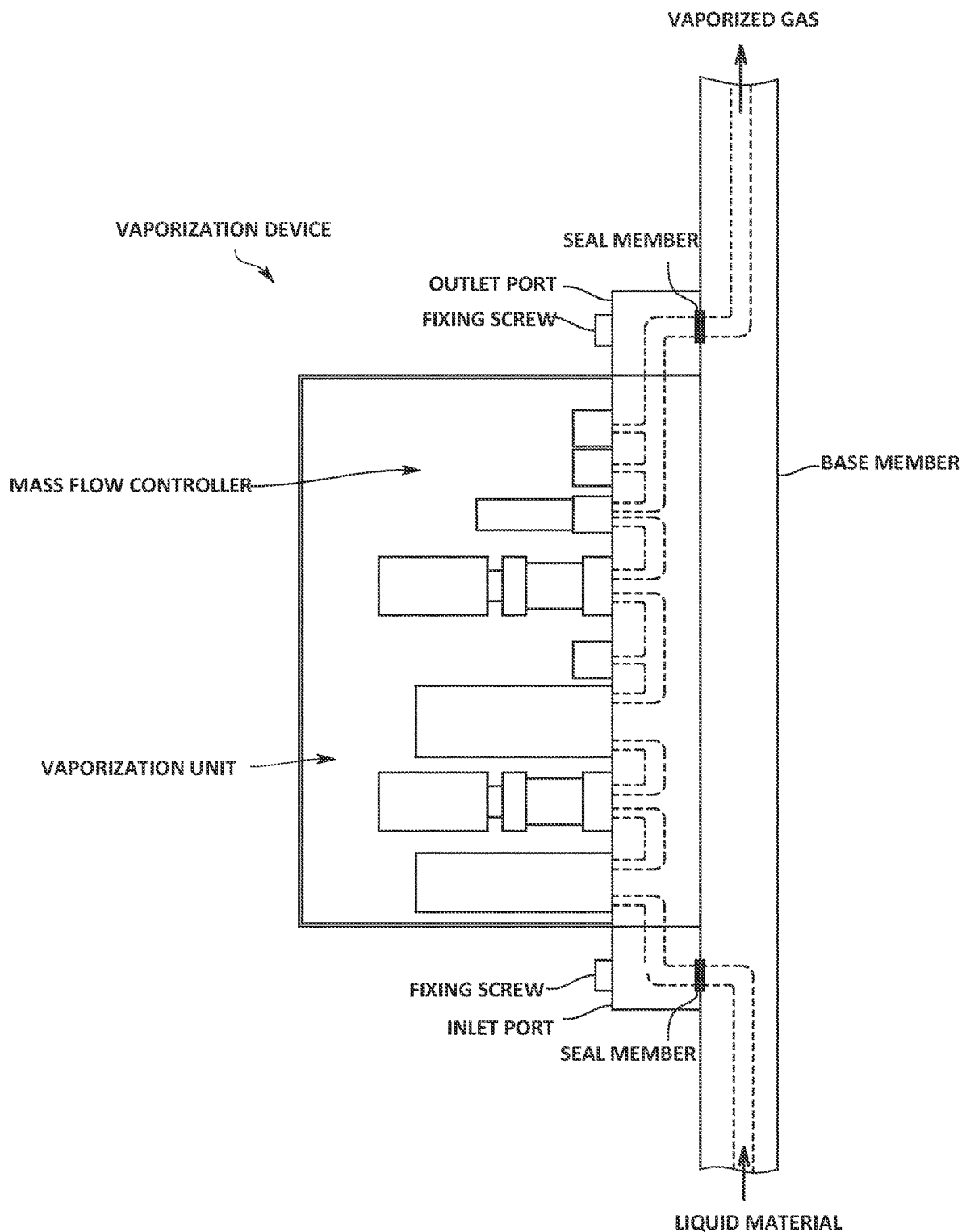
FIG. 10 is a schematic view illustrating a configuration of a conventional vaporization system.

In the vaporization system 100 according to the above embodiment, each of the inlet port $P_i$ and the outlet port $P_o$ is connected to the semiconductor manufacturing line through the corresponding one of the pipe members 42. However, the present invention is not limited to this configuration. In a vaporization system 100 according to yet another embodiment, only one of the inlet port $P_i$ and the outlet port $P_o$ may be connected to the semiconductor manufacturing line through the corresponding one of the pipe members 42. For example, as illustrated in FIG. 9, the inlet port $P_i$ (or the outlet port $P_o$) may be screwed and fixed onto the base member F with fixing screws 7, with a seal member interposed therebetween, to be caused to communicate with an internal flow path formed in the base member F.

The vaporization system 100 according to the above embodiment may not include the mass flow controller 3, while the vaporization system 100 may include at least the vaporizer 21 and the supply flow rate controller 22.

In the above embodiment, the vaporization device 1 is placed such that the longitudinal direction of the vaporization device 1 faces the upper-lower direction (vertical direction). However, the vaporization device 1 may be placed on the base member F such that the longitudinal direction of the vaporization device 1 faces the left-right direction (horizontal direction). The vaporization device 1 may be fixed onto the base member F such that the inlet port $P_i$ is positioned on an upper side of the outlet port $P_o$.

The mass flow controller 3 according to the above embodiment is a so-called pressure type mass flow controller. However, the present invention is not limited to this configuration, and the mass flow controller 3 may be a so-called thermal type mass flow controller.

Further, the present invention is not limited to the embodiments described above, and it goes without saying that various modifications can be made without departing from the spirit of the present invention.

INDUSTRIAL APPLICABILITY

According to the present invention, it is possible to reduce weight of a vaporization device applied to a screw with which a seal member is tightened, and to reduce non-uniformity in tightening surface pressure applied to the seal member, therefore improving sealing performance.

The invention claimed is:
1. A vaporization system comprising:
   a vaporization device that is configured to vaporize a liquid material, the vaporization device including:

a vaporizer that is configured to vaporize the liquid material;

a supply flow rate controller that is configured to control a supply flow rate of the liquid material to the vaporizer;

a casing that houses the vaporizer and the supply flow rate controller; and an inlet port through which the liquid material is introduced and an outlet port through which vaporized gas generated by vaporizing the liquid material is discharged, the inlet port and the outlet port being provided on an exterior of the casing; and a connection mechanism, provided on the exterior of the casing, that screws and fixes the vaporization device onto a base, the connection mechanism including:

at least one first fixing screw with which a mounting surface of a fixed port, which is at least one of the inlet port or the outlet port, is screwed and fixed onto the base;

at least one pipe member that is configured to communicate with the fixed port and through which the vaporized gas or the liquid material flows; and at least one second fixing screw with which a pipe member mounting surface of the at least one pipe member is screwed and fixed onto the fixed port with a seal member interposed between the at least one pipe member and the fixed port, wherein in the fixed port, the mounting surface and the pipe member mounting surface are formed on different surfaces.

2. The vaporization system according to claim 1, wherein in the fixed port, the pipe member mounting surface is formed on a surface opposite to the mounting surface.

3. The vaporization system according to claim 1,
wherein the at least one first fixing screw includes a plurality of first fixing screws, and each of the inlet port and the outlet port is screwed on the base with a corresponding one of the plurality of first fixing screws,
wherein the at least one pipe member includes:
an inlet-side pipe member that is configured to communicate with the inlet port and through which the liquid material flows; and
an outlet-side pipe member that is configured to communicate with the outlet port and through which the vaporized gas flows, and
wherein the at least one second fixing screw includes a plurality of second fixing screws, and each of the inlet-side pipe member and the outlet-side pipe is screwed on a corresponding one of the ports with a corresponding one of the plurality of second fixing screws, with a corresponding one of seal members interposed between each of the inlet-side pipe member and the outlet-side pipe, and the corresponding one of the ports.

4. The vaporization system according to claim 3,
wherein the inlet port is provided on one end side of the vaporization device, and the outlet port is provided on another end side of the vaporization device, and
wherein the vaporization device is fixed on the base in a state where the inlet port and the outlet port are positioned one below another or vice versa in a vertical direction.

5. The vaporization system according to claim 1,
wherein the at least one pipe member includes at least one external pipe, and at least one communication member through which the at least one external pipe and the fixed port are caused to communicate with each other, and
wherein the at least one communication member has one end that is screwed on the fixed port and another end that is screwed on the at least one external pipe.

6. The vaporization system according to claim 1, wherein the vaporization device further includes a mass flow controller that is configured to control a flow rate of vaporized gas generated by vaporizing in the vaporizer.

7. A method of fixing a vaporization device onto a base, the vaporization device being configured to vaporize a liquid material, the vaporization device including:

a vaporizer that is configured to vaporize the liquid material;

a supply flow rate controller that is configured to control a supply flow rate of the liquid material to the vaporizer;

a casing that houses the vaporizer and the supply flow rate controller; and an inlet port through which the liquid material is introduced and an outlet port through which vaporized gas generated by vaporizing the liquid material is discharged, the inlet port and the outlet port being provided on an exterior of the casing, the method comprising:

screwing and fixing a mounting surface of a fixed port, which is at least one of the inlet port or the outlet port, onto a base; and screwing and fixing, onto the fixed port, a pipe member mounting surface of at least one pipe member that is configured to communicate with the fixed port and through which the vaporized gas or the liquid material flows, with a seal member interposed between the at least one pipe member and the fixed port, wherein in the fixed port, the mounting surface and the pipe member mounting surface are formed on different surfaces.

* * * * *